(12) United States Patent
Nozawa et al.

(10) Patent No.: US 7,679,428 B2
(45) Date of Patent: Mar. 16, 2010

(54) COMPARATOR AND ANALOG-TO-DIGITAL CONVERTER USING THE SAME

(75) Inventors: Mai Nozawa, Kawasaki (JP); Daisuke Kurose, Kawasaki (JP); Takeshi Ueno, Kawasaki (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 12/175,209

(22) Filed: Jul. 17, 2008

(65) Prior Publication Data

US 2009/0045995 A1 Feb. 19, 2009

(30) Foreign Application Priority Data

Aug. 13, 2007 (JP) ............................. 2007-210887

(51) Int. Cl.
*H03K 5/22* (2006.01)
(52) U.S. Cl. ......................... 327/534; 327/74; 327/75
(58) Field of Classification Search .................. 327/74, 327/75, 534
See application file for complete search history.

(56) References Cited

U.S. PATENT DOCUMENTS

| | | | | |
|---|---|---|---|---|
| 5,157,279 A | * | 10/1992 | Lee | 326/83 |
| 6,239,649 B1 | * | 5/2001 | Bertin et al. | 327/534 |
| 6,404,243 B1 | * | 6/2002 | Koch et al. | 327/107 |
| 6,469,568 B2 | * | 10/2002 | Toyoyama et al. | 327/534 |
| 6,741,104 B2 | * | 5/2004 | Forbes et al. | 327/55 |
| 6,989,706 B2 | | 1/2006 | Sekigawa et al. | |
| 7,123,076 B2 | * | 10/2006 | Hatakeyama et al. | 327/534 |
| 7,378,899 B2 | * | 5/2008 | Hatakeyama et al. | 327/534 |
| 7,382,162 B2 | * | 6/2008 | Chiang et al. | 326/121 |
| 7,492,215 B2 | * | 2/2009 | Lee et al. | 327/544 |

(Continued)

FOREIGN PATENT DOCUMENTS

JP 9-162408 6/1997

(Continued)

OTHER PUBLICATIONS

Cho et al.; "A 10 b, 20 Msample/s, 35 mW Pipeline A/D Converter", IEEE Journal of Solid-State Circuits, vol. 30, No. 3, pp. 166-172, (1995).

(Continued)

*Primary Examiner*—Kenneth B. Wells
(74) *Attorney, Agent, or Firm*—Finnegan, Henderson, Farabow, Garrett & Dunner, L.L.P.

(57) ABSTRACT

A comparator includes a first inverter which is inserted between a power source terminal and one end of a first variable resistor, includes a first FinFET provided with a first gate terminal for receiving a positive phase output signal, and a second gate terminal for receiving a clock signal changing between a first level and a second level, inverts the positive phase output signal, and outputs a negative phase output signal, and a second inverter which is inserted between the power source terminal and one end of a second variable resistor, includes a second FinFET provided with a third gate terminal for receiving the negative phase output signal, a fourth gate terminal for receiving the clock signal, and the same polarity as the first FinFET, inverts the negative phase output signal, and outputs the positive phase output signal.

6 Claims, 7 Drawing Sheets

U.S. PATENT DOCUMENTS

| | | |
|---|---|---|
| 2005/0199964 A1 | 9/2005 | Sekigawa et al. |
| 2007/0013413 A1 | 1/2007 | Chiang et al. |
| 2007/0171748 A1 | 7/2007 | Mukhopadhyay et al. |
| 2008/0061878 A1 | 3/2008 | Kurose et al. |
| 2008/0143434 A1 | 6/2008 | Ito et al. |

FOREIGN PATENT DOCUMENTS

| | | |
|---|---|---|
| JP | 2002-118446 | 4/2002 |
| JP | 2004-296795 | 10/2004 |
| JP | 2005-260607 | 9/2005 |
| JP | 2005-277352 | 6/2006 |

OTHER PUBLICATIONS

Official Notice of Rejection, dated Aug. 18, 2009 in corresponding Japanese Patent Application No. 2007-210887. (4 pages including 2 pages Official Notice of Rejection and 2 pages English translation thereof).

"The Latests FinFET—Process and Integration Techniques," Satoshi Inaba, Journal of The Japan Society of Electronic Information and Communication Research, vol. 91, No. 1, 2008 (pp. 25-29).

* cited by examiner

COMPARATOR AND ANALOG-TO-DIGITAL CONVERTER USING THE SAME

CROSS-REFERENCE TO RELATED APPLICATIONS

This application is based upon and claims the benefit of priority from prior Japanese Patent Application No. 2007-210887, filed Aug. 13, 2007, the entire contents of which are incorporated herein by reference.

BACKGROUND OF THE INVENTION

1. Field of the Invention

The present invention relates to a comparator for comparing an input signal with a reference signal, and an analog-to-digital converter using the comparator.

2. Description of the Related Art

In general, a comparator (analog comparator) is configured to compare an analog input voltage with a reference voltage, and output a digital signal of a high (H) level or a low (L) level according to a comparison result. Further, in the analog-to-digital converter (hereinafter simply referred to as an ADC), a plurality of comparators having different reference voltages are used to convert an analog input voltage into a digital signal. In an ordinary ADC, a voltage generating circuit for generating a plurality of different reference voltages becomes necessary.

As a method of configuring a comparator, a comparator including a circuit in which input sections and output sections of two inverters are connected to each other in an annular form is known. According to "Thomas Bynghak Cho, and Paul R. Gray, "Thomas Byunghak Cho, and Paul R. Gray, "A 10 b, 20 Msample/s 35 mW Pipeline A/D Converter", IEEE J. of Solid-State Circuits Vol. 30, No. 3, March 1995. (FIG. 1)" (related art), as one of comparators having the annular circuit, a comparator of a built-in threshold type is described.

In the built-in threshold type comparator, a variable resistor a resistance value of which changes according to the input voltage and the reference voltage is provided between each of both the inverters and the power source (high potential power source) or between each of both the inverters and the ground power source (low potential power source). Each of both the inverters is provided with two switches (transistor switches) which are called a reset switch, and an on/off switch. The reset switch is used to reset an output voltage of the inverter to the power source voltage or the ground power source voltage. The on/off switch is inserted in series between an NMOS transistor and a PMOS transistor of the inverter, and is used to control turning on/off of the inverter by closing or opening the connection between the two transistors. A description will be given below on the assumption that the variable resistor is provided between each of both the inverters and the ground power source, and the reset switch is used to reset the output voltage of the inverter to the power source voltage.

In the built-in threshold type comparator, the output is reset before the comparison operation is started. That is, the reset switches of both the inverters are set ON, and the outputs of both the inverters coincide with the power source voltage. As a result of this, it is possible to prevent an influence of the previous comparison result from propagating to the next comparison result. Further, during the period in which the reset switch is in the on-state, the on/off switch is set in the off-state, and thus the shoot-through current is suppressed, thereby reducing the power consumption.

After the above-mentioned resetting is completed, the comparison operation is performed. At the time of the comparison operation, the reset switch is set in the off-state, and the on/off switch is set in the on-state. Then, a current flows from an output terminal of each of both the inverters to the variable resistor, and a voltage drop is caused. At this time, the resistance values of both the variable resistors differ from each other depending on the values of the input voltage and the reference voltage, and hence the voltage falling speeds of both the inverter outputs differ from each other. As a result of this, a latch state where the one inverter output is high, and the other inverter output is low is obtained.

In the ADC using such a built-in threshold type comparator, the reference voltage can be scaled up/down by changing the size ratio of the transistor for receiving the input voltage to the transistor for receiving the reference voltage. Accordingly, the number of reference voltages to be generated may be one, and a voltage generating circuit for generating a plurality of reference voltages is not necessary unlike the ordinary ADC.

In the built-in threshold type comparator described in the related art, the operation speed is lowered by the ON resistance of the on/off switch. If the size of the transistor used for the on/off switch is made larger, the ON resistance can be made small. In this case, however, a capacitance of the parasitic capacitor is increased concomitantly with an increase in size. If the parasitic capacity is increased, the operation speed of the comparator is lowered, and hence increasing the transistor size of the on/off switch is not always connected with improvement in the operation speed.

BRIEF SUMMARY OF THE INVENTION

According to an aspect of the invention, there is provided a comparator comprising: a first and a second power source terminals; a first variable resistor which is connected to the first power source terminal at one end, and a resistance value of which changes according to voltages of a positive phase input signal and a negative phase reference signal; a second variable resistor which is connected to the first power source terminal at one end, and a resistance value of which changes according to voltages of a negative phase input signal and a positive phase reference signal; a first inverter which is inserted between the second power source terminal and other end of the first variable resistor, includes a first FinFET provided with a first gate terminal for receiving a positive phase output signal, and a second gate terminal for receiving a clock signal changing between a first level and a second level, inverts the positive phase output signal, and outputs a negative phase output signal; a second inverter which is inserted between the second power source terminal and other end of the second variable resistor, includes a second FinFET provided with a third gate terminal for receiving the negative phase output signal, a fourth gate terminal for receiving the clock signal, and the same polarity as the first FinFET, inverts the negative phase output signal, and outputs the positive phase output signal; and a first switch and a second switch which reset the output voltages of the first inverter and the second inverter to a voltage of the first or the second power source terminal when the clock signal is at the first level.

According to another aspect of the invention, there is provided a comparator comprising: a first and a second power source terminals; a first variable resistor which is connected to the first power source terminal at one end, and a resistance value of which changes according to voltages of a positive phase input signal and a negative phase reference signal; a second variable resistor which is connected to the first power source terminal at one end, and a resistance value of which changes according to voltages of a negative phase input signal and a positive phase reference signal; a first inverter which is inserted between the second power source terminal and other end of the first variable resistor, includes a first FinFET of one conductivity type provided with a first gate terminal for receiving a positive phase output signal, and a second gate terminal for receiving a clock signal changing between a first level and a second level, and a second FinFET of opposite conductivity type provided with a third gate terminal for receiving the positive phase output signal, and a fourth gate terminal for receiving the clock signal, inverts the positive phase output signal, and outputs a negative phase output signal; and a second inverter which is inserted between the second power source terminal and other end of the second variable resistor, includes a third FinFET of the one conductivity type provided with a fifth gate terminal for receiving the negative phase output signal, and a sixth gate terminal for receiving the clock signal, and a fourth FinFET of the opposite conductivity type provided with a seventh gate terminal for receiving the negative phase output signal, and an eighth gate terminal for receiving the clock signal, inverts the negative phase output signal, and outputs the positive phase output signal.

According to another aspect of the invention, there is provided a comparator comprising: a first and a second power source terminals; a first variable resistor which is connected to the first power source terminal at one end, and a resistance value of which changes according to voltages of a positive phase input signal and a negative phase reference signal; a second variable resistor which is connected to the first power source terminal at one end, and a resistance value of which changes according to voltages of a negative phase input signal and a positive phase reference signal; a first inverter which is inserted between the second power source terminal and other end of the first variable resistor, includes a first FinFET provided with a first gate terminal for receiving a positive phase output signal, and a second gate terminal, inverts the positive phase output signal, and outputs a negative phase output signal; a second inverter which is inserted between the second power source terminal and other end of the second variable resistor, includes a second FinFET of the same polarity as the first FinFET provided with a third gate terminal for receiving the negative phase output signal, and a fourth gate terminal, inverts the negative phase output signal, and outputs the positive phase output signal; a first switch and a second switch which reset the output voltages of the first inverter and the second inverter to a voltage of the first or the second power source terminal when a clock signal changing between a first level and a second level is at the first level; a third switch which connects the second gate terminal to one of the first power source terminal and the first gate terminal, based on the clock signal; and a fourth switch which connects the fourth gate terminal to one of the first power source terminal and the third gate terminal, based on the clock signal.

According to another aspect of the invention, there is provided a comparator comprising: a first and a second power source terminals; a first variable resistor which is connected to the first power source terminal at one end, and a resistance value of which changes according to voltages of a positive phase input signal and a negative phase reference signal; a second variable resistor which is connected to the first power source terminal at one end, and a resistance value of which changes according to voltages of a negative phase input signal and a positive phase reference signal; a first inverter which is inserted between the second power source terminal and other end of the first variable resistor, includes a first FinFET of one conductivity type provided with a first gate terminal for receiving a positive phase output signal, and a second gate terminal, and a second FinFET of opposite conductivity type provided with a third gate terminal for receiving the positive phase output signal, and a fourth gate terminal, inverts the positive phase output signal, and outputs a negative phase output signal; a second inverter which is inserted between the second power source terminal and other end of the second variable resistor, includes a third FinFET of the one conductivity type provided with a fifth gate terminal for receiving the negative phase output signal, and a sixth gate terminal, and a fourth FinFET of the opposite conductivity type provided with a seventh gate terminal for receiving the negative phase output signal, and an eighth gate terminal, inverts the negative phase output signal, and outputs the positive phase output signal; a first switch which connects the second gate terminal and the fourth gate terminal to one of the first power source terminal and the first gate terminal, based on the clock signal; and a second switch which connects the sixth gate terminal and the eighth gate terminal to one of the first power source terminal and the fifth gate terminal, based on the clock signal.

DETAILED DESCRIPTION OF THE INVENTION

Embodiments of the present invention will be described below with reference to the accompanying drawings.

First Embodiment

Figure 1:
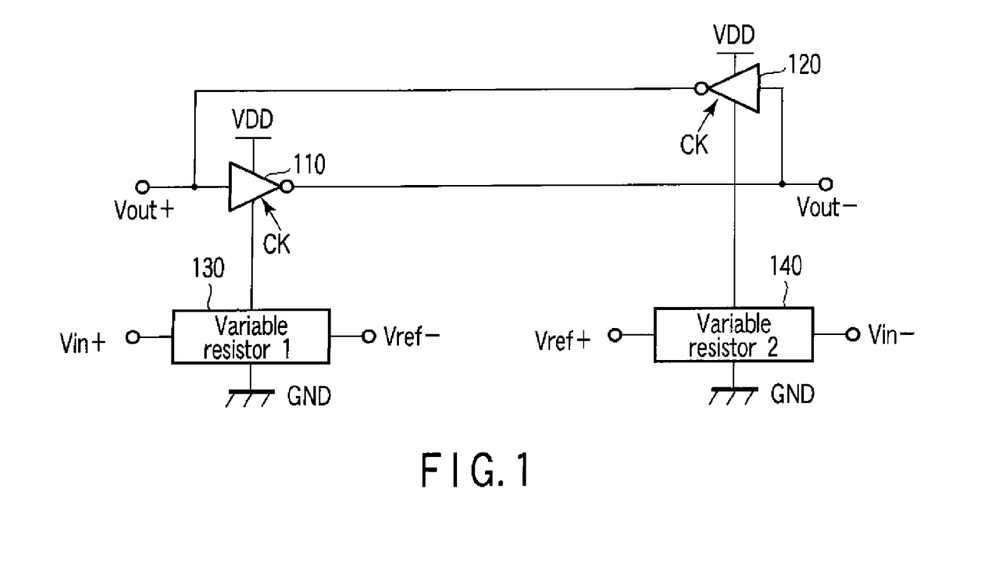
FIG. 1 is a block diagram showing a comparator according to a first embodiment.

As shown in FIG. 1, a comparator according to a first embodiment of the present invention is provided with an inverter 110, an inverter 120, a variable resistor 130, and a variable resistor 140. Incidentally, in FIG. 1, although the variable resistors 130 and 140 are inserted between the inverters 110 and 120 and the ground power source GND, respectively, they may be inserted between the inverters 110 and 120 and the power source VDD, respectively.

Figure 2A:
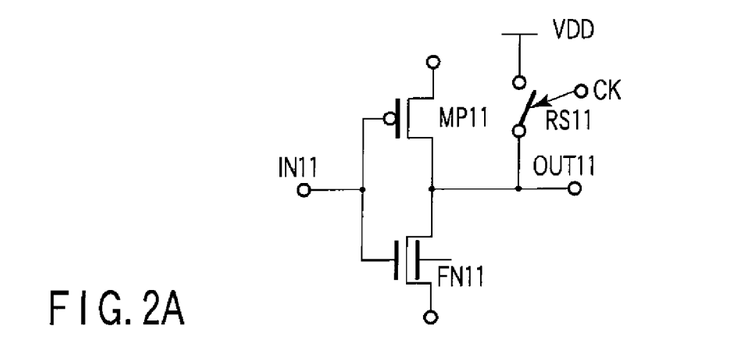
FIG. 2A is a circuit diagram showing an example of the inverter shown in FIG. 1.
Figure 2B:
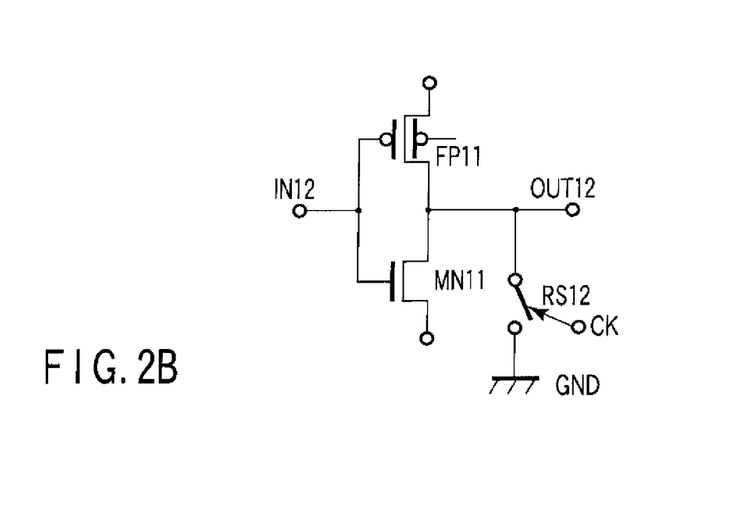
FIG. 2B is a circuit diagram showing an example of the inverter shown in FIG. 1.
Figure 2C:
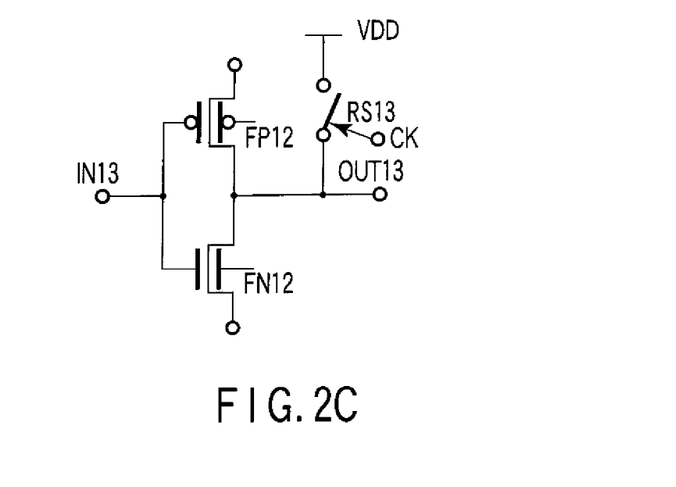
FIG. 2C is a circuit diagram showing an example of the inverter shown in FIG. 1.

The inverter 110 and the inverter 120 are inverters of the same configuration, and each of them outputs an inverted input signal. More specifically, an inverter shown in one of, for example, FIGS. 2A, 2B, and 2C is used as the inverter 110 or 120. Here, the inverters shown in FIGS. 2A, 2B, and 2C will be described below.

The inverter shown in FIG. 2A is a general CMOS inverter in which an NMOS FINFET FN11 is used in place of an NMOS transistor, and which is provided with a reset switch RS11 controlled by a clock signal CK between an inverter output terminal OUT11 and the power source VDD. The reset switch RS11 is, for example, a PMOS transistor which receives a clock signal CK at a gate terminal thereof. The inverter shown in FIG. 2A inverts a signal input to an input terminal IN11, and outputs the inverted signal from an output terminal OUT11.

Here, the N (P) MOS FinFET will be described. The N (P) MOS FinFET is a double-gate transistor provided with a first gate and a second gate, and the two gates can be treated independently. Accordingly, it becomes possible to separately apply two voltages to both the gate terminals.

In the inverter shown in FIG. 2A, the clock signal CK is input to the second gate terminal of the NMOS FINFET FN11. Here, a threshold voltage Vt of the NMOS FINFET FN11 is set in such a manner that when the clock signal CK is low, the NMOS FINFET FN11 is in the cutoff region irrespective of the level (high or low) of the voltage input to the first gate terminal. That is, the second gate terminal of the NMOS FINFET FN11 operates as a so-called on/off switch, and turns off the operation of the inverter when the clock signal CK is low, and turns on the operation of the inverter when the clock signal CK is high. On the other hand, the reset switch RS11, contrary to the on/off switch, short-circuits the inverter output terminal OUT11 and the power source to reset the output when the clock signal CK is low, and opens the short-circuited part between the inverter output terminal OUT11 and the power source when the clock signal CK is high. That is, both the switches operate complementarily such that when one of them is in the on-state, the other is in the off-state, thereby suppressing a shoot-through current.

The inverter shown in FIG. 2B is a general CMOS inverter in which a PMOS FINFET FP11 is used in place of a PMOS transistor, and which is provided with a reset switch RS12 controlled by a clock signal CK between an inverter output terminal OUT12 and the ground power source GND. The reset switch RS12 is, for example, an NMOS transistor which receives a clock signal CK at a gate terminal thereof. The inverter shown in FIG. 2B inverts a signal input to an input terminal IN12, and outputs the inverted signal from an output terminal OUT12.

In the inverter shown in FIG. 2B, a clock signal CK is input to a second gate terminal of the PMOS FINFET FP11. Here, a threshold voltage Vt of the PMOS FINFET FP11 is set in such a manner that when the clock signal CK is high, the PMOS FINFET FP11 is in the cutoff region irrespective of the level (high or low) of the voltage input to the first gate terminal. That is, the second gate terminal of the PMOS FINFET FP11 operates as a so-called on/off switch, and turns off the operation of the inverter when the clock signal CK is high, and turns on the operation of the inverter when the clock signal CK is low. On the other hand, the reset switch RS12, contrary to the on/off switch, short-circuits the inverter output terminal OUT12 and the ground power source GND to reset the output when the clock signal CK is high, and opens the short-circuited part between the inverter output terminal OUT12 and the ground power source GND when the clock signal CK is low. That is, both the switches operate complementarily such that when one of them is in the on-state, the other is in the off-state, thereby suppressing a shoot-through current.

The inverter shown in FIG. 2C is a general CMOS inverter in which an NMOS FINFET FN12, and a PMOS FINFET FP12 are used in place of an NMOS transistor and a PMOS transistor, and which is provided with a reset switch RS13 controlled by a clock signal CK between an inverter output terminal OUT13 and the power source VDD. The reset switch RS13 is, for example, a PMOS transistor which receives a clock signal CK at a gate terminal thereof. The inverter shown in FIG. 2C inverts a signal input to an input terminal IN13, and outputs the inverted signal from an output terminal OUT13.

In the inverter shown in FIG. 2C, the clock signal CK is input to the second gate terminal of the NMOS FINFET FN12. Here, a threshold voltage Vt of the NMOS FINFET FN12 is set in such a manner that when the clock signal CK is low, the NMOS FINFET FN12 is in the cutoff region irrespective of the level (high or low) of the voltage input to the first gate terminal. That is, the second gate terminal of the NMOS FINFET FN12 operates as a so-called on/off switch, and turns off the operation of the inverter when the clock signal CK is low, and turns on the operation of the inverter when the clock signal CK is high. On the other hand, the reset switch RS13, contrary to the on/off switch, short-circuits the inverter output terminal OUT13 and the power source to reset the output when the clock signal CK is low, and opens the short-circuited part between the inverter output terminal OUT13 and the power source when the clock signal CK is high. That is, both the switches operate complementarily such that when one of them is in the on-state, the other is in the off-state, thereby suppressing a shoot-through current.

Further, in the inverter shown in FIG. 2C, although the reset switch RS13 is provided between the inverter output terminal OUT13 and the power source VDD, the reset switch RS13 may be provided between the inverter output terminal OUT13 and the ground power source GND. In this case, the clock signal CK is made to be input to the second gate terminal of the PMOS FINFET FP12, whereby the second gate terminal is made to function as an on/off switch. That is, a threshold voltage Vt of each of the PMOS FINFET FP12 and the NMOS transistor used as the reset switch RS13 is set in such a manner that when the clock signal CK is high, the on/off switch is in the off-state, and the reset switch RS13 is in the on-state, and when the clock signal CK is low, the on/off switch is in the on-state, and the reset switch RS13 is in the off-state.

Each of the variable resistors 130 and 140 is provided with two control terminals, and the resistance value changes according to the voltages applied to both the control terminals. Each of the variable resistors 130 and 140 is constituted of transistors, whereby the circuit area can be made small. More specifically, a variable resistor shown in one of FIGS. 3A, 3B, 3C, and 3D can be used as the variable resistor 130 or 140.

Figure 3A:
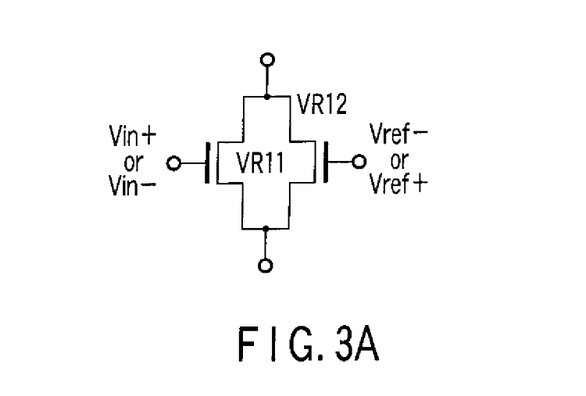
FIG. 3A is a circuit diagram showing an example of the variable resistor shown in FIG. 1.
Figure 3B:
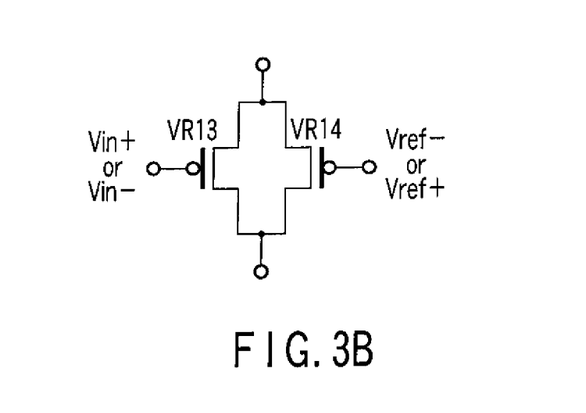
FIG. 3B is a circuit diagram showing an example of the variable resistor shown in FIG. 1.

The variable resistor shown in FIG. 3A is constituted by connecting two NMOS transistors VR11 and VR12 which operate in the linear region in parallel with each other, and the gate terminals of both the transistors VR11 and VR12 are used as the above-mentioned control terminals. One of an input voltage Vin and a reference voltage Vref is applied to each control terminal. That is, a first input voltage (positive phase input voltage) Vin+ and a second reference voltage (negative phase reference voltage) Vref− are applied to the control terminals of the variable resistor 130, and a first reference voltage (positive phase reference voltage) Vref+ and a second input voltage (negative phase input voltage) Vin− are applied to the control terminals of the variable resistor 140. The variable resistor shown in FIG. 3B is the variable resistor shown in FIG. 3A in which the NMOS transistors VR11 and VR12 are replaced with PMOS transistors VR13 and VR14. Incidentally, the variable resistor shown in FIG. 3A is inserted between the inverter and the ground power source GND, and the variable resistor shown in FIG. 3B is inserted between the inverter and the power source VDD.

Figure 3C:
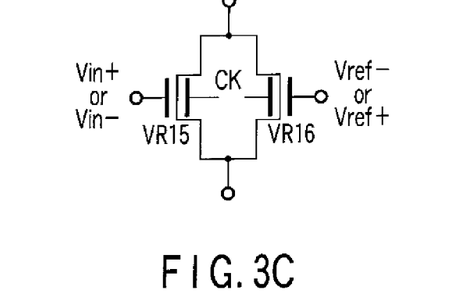
FIG. 3C is a circuit diagram showing an example of the variable resistor shown in FIG. 1.
Figure 3D:
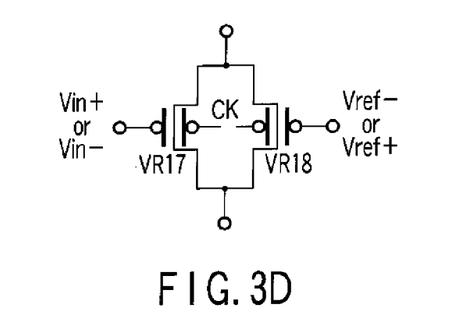
FIG. 3D is a circuit diagram showing an example of the variable resistor shown in FIG. 1.

The variable resistor shown in FIG. 3C or FIG. 3D is the variable resistor shown in FIG. 3A or FIG. 3B in which the NMOS transistors VR11 and VR12 or the PMOS transistors VR13 and VR14 are replaced with NMOS FinFETs VR15 and VR16 or PMOS FinFETs VR17 and VR18, and a clock signal CK is input to second gate terminals of the NMOS FinFETs VR15 and VR16 or the PMOS FinFETs VR17 and VR18. The operation principle of the variable resistors shown in FIGS. 3C and 3D is basically the same as the variable resistors shown in FIGS. 3A and 3B, and the NMOS FinFETs VR15 and VR16 or the PMOS FinFETs VR17 and VR18 are operated in the linear region.

Unlike the variable resistors shown in FIGS. 3A and 3B, in the variable resistors shown in FIGS. 3C and 3D, the operation is turned on/off according to the level of the clock signal CK input to the second gate terminal. That is, by synchronizing turning on/off of the variable resistor with turning on/off of the on/off switch in the inverter, it is possible to restrict a leak current from the inverter. More specifically, when an NMOS FinFET is used as the on/off switch in the inverter, the variable resistor shown in FIG. 3C is constituted of NMOS FinFETs VR15 and VR16 each having the same threshold voltage Vt as the NMOS FinFET of the on/off switch. Further, when a PMOS FinFET is used as the on/off switch in the inverter, the variable resistor shown in FIG. 3D is constituted of PMOS FinFETs VR17 and V18 each having the same threshold voltage Vt as the PMOS FinFET of the on/off switch. Incidentally, the variable resistor shown in FIG. 3C is inserted between the inverter and the ground power source SND, and the variable resistor shown in FIG. 3D is inserted between the inverter and the power source VDD.

As described above, the comparator according to this embodiment can be realized, in the comparator shown in FIG. 1, by arbitrarily selecting and employing one of the inverters shown in FIGS. 2A, 2B, and 2C, and selecting and employing one of the variable resistors shown in FIGS. 3A, 3B, 3C, and 3D. Examples of the comparator according to this embodiment will be described below with reference to FIGS. 4 and 5.

Figure 4:
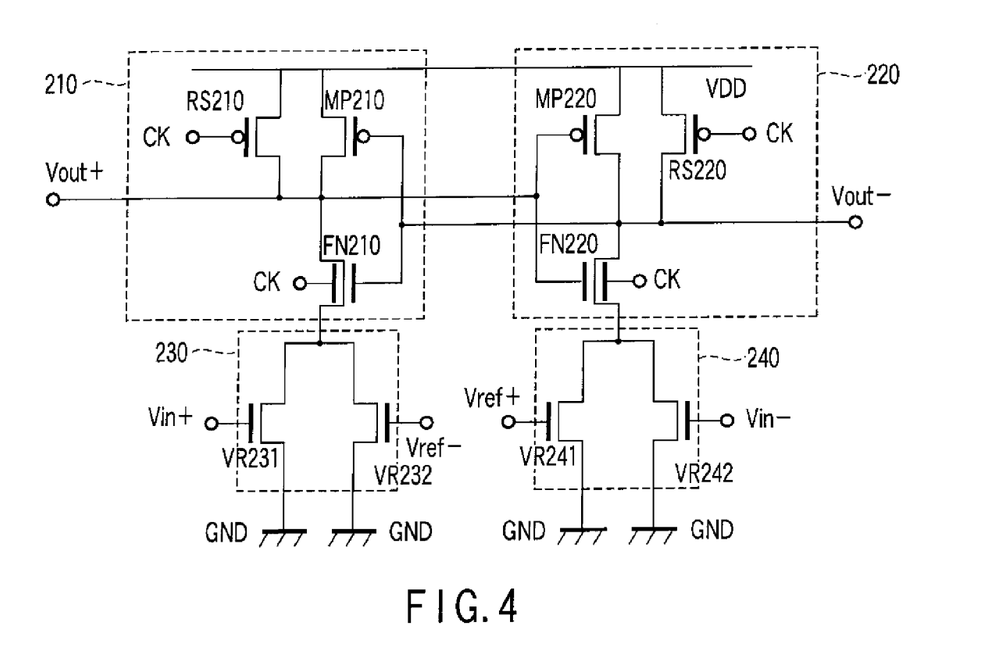
FIG. 4 is a circuit diagram showing an example of the comparator shown in FIG. 1.

In the comparator shown in FIG. 4, the inverter shown in FIG. 2A is used as inverters 210 and 220, and the variable resistor shown in FIG. 3A is used as variable resistors 230 and 240. In the comparator shown in FIG. 4, a reset operation and a comparison operation are repeated according to the period of the clock signal CK. When a low clock signal CK is input, reset switches RS210 and RS220 in the inverters 210 and 220 are turned on, and the on/off switches are turned off. Accordingly, both the output voltages Vout+ and Vout− of the inverters 210 and 220 are reset to the voltage of the power source VDD, and hence the comparator is not affected by the previous comparison result. Incidentally, during this period, the shoot-through current is suppressed because the NMOS FIN-FETs FN210 and FN220 are in the cutoff region. Subsequently, when the high clock signal CK is input, the reset switches RS210 and RS220 in the inverters 210 and 220 are turned off, and the on/off switches are turned on. Then, the output voltages Vout+ and Vout− which have been reset to the voltage of the power source VDD begin to fall. At this time, the variable resistors 230 and 240 differ from each other in the resistance value depending on the levels of the applied input voltage Vin and the reference voltage Vref, and hence the voltage falling rates of the output voltages Vout+ and Vout− differ from each other. Accordingly, the comparator is brought into the latch state where one of the output voltages Vout+ and Vout− is high, and the other is low. As described above, in the comparator shown in FIG. 4, the reset operation and the comparison operation are repeated according to the level of the clock signal CK.

Figure 5:
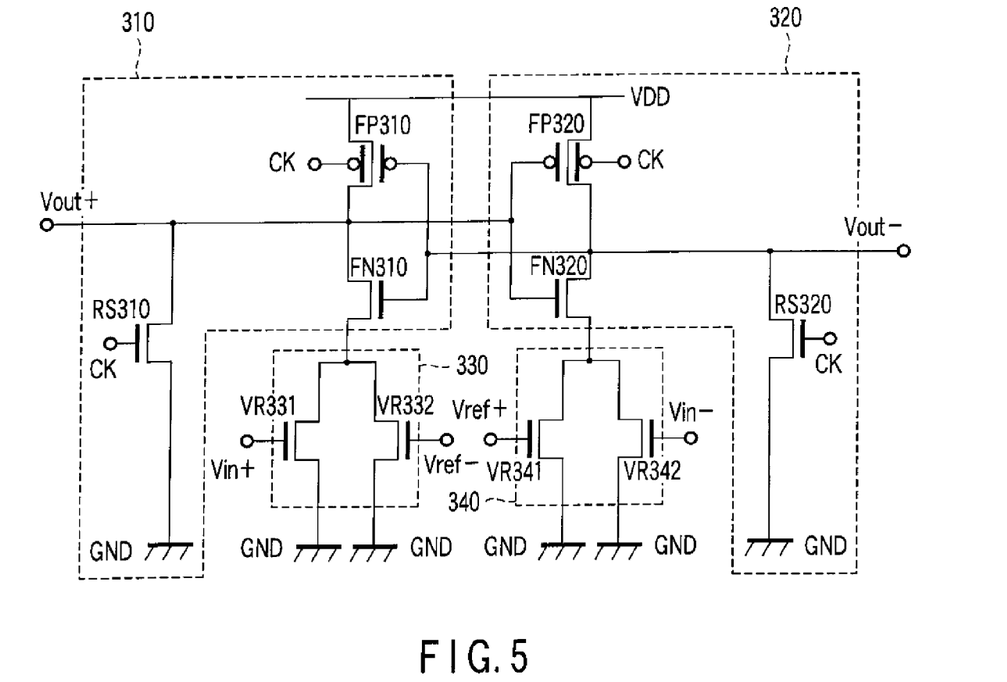
FIG. 5 is a circuit diagram showing an example of the comparator shown in FIG. 1.

In the comparator shown in FIG. 5, the inverter shown in FIG. 2B is used as inverters 310 and 320, and the variable resistor shown in FIG. 3A is used as variable resistors 330 and 340. In the comparator shown in FIG. 5, a reset operation and a comparison operation are repeated according to the period of the clock signal CK. When a high clock signal CK is input, reset switches RS310 and RS320 in the inverters 310 and 320 are turned on, and the on/off switches are turned off. Accordingly, both the output voltages Vout+ and Vout− of the inverters 310 and 320 are reset to the voltage of the ground power source GND, and hence the comparator is not affected by the previous comparison result. During this period, the shoot-through current is suppressed because the PMOS FINFETs FP310 and FP320 are in the cutoff region. Subsequently, when the low clock signal CK is input, the reset switches RS310 and RS320 in the inverters 310 and 320 are turned off, and the on/off switches are turned on. Then, the output voltages Vout+ and Vout− which are reset to the voltage of the power source VDD begin to rise. At this time, the variable resistors 330 and 340 differ from each other in the resistance value depending on the level of the applied input voltage Vin and the reference voltage Vref, and hence the voltage rising rates of the output voltages Vout+ and Vout− differ from each other. Accordingly, the comparator is brought into the latch state where one of the output voltages Vout+ and Vout− is high, and the other is low. As described above, in the comparator shown in FIG. 5, the reset operation and the comparison operation are repeated according to the level of the clock signal CK.

As described above, in the comparator according to this embodiment, at least one of the NMOS transistor and the PMOS transistor constituting the CMOS inverter is replaced with a FinFET, and the second gate terminal is made to function as an on/off switch. Therefore, according to the comparator associated with this embodiment, it is possible to further suppress lowering of the operation speed of the comparator due to the ON resistance as compared with the case where the on/off switch is inserted in series between the inverter and the variable resistor.

Second Embodiment

Figure 6:
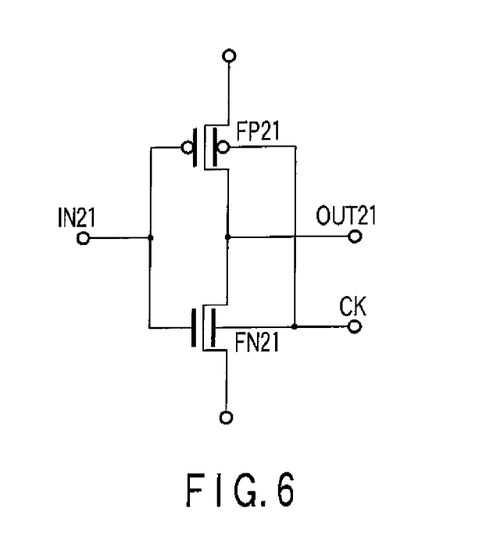
FIG. 6 is a circuit diagram showing an inverter used for a comparator according to a second embodiment.

In a comparator according to a second embodiment of the present invention, an inverter shown in FIG. 6 is used. The inverter shown in FIG. 6 is constituted of an NMOS FINFET FN21 and a PMOS FINFET FP21, an inverter input signal is received by first gate terminals (input terminal IN21) of both the FINFET FN21 and FR21, and an inverted output is extracted from drain terminals (output terminal OUT21) of both the FINFET FN21 and FP21. A clock signal CK is input to second gate terminals of both the FINFET FN21 and FP21, and one of both the FINFET FN21 and FP21 functions as a reset switch, and the other functions as an on/off switch. Assignment of the reset switch and the on/off switch to both the FINFETs is realized by setting the threshold voltage Vt in the manner described below.

First, setting of the threshold voltage Vt of a case where the PMOS FINFET FP21 is made to function as a reset switch, and the NMOS FINFET FN21 is made to function as an on/off switch will be described below. In order to assign the switch functions as described above, the threshold voltage Vt is set in such a manner that when the clock signal CK is low, the PMOS FINFET FP21 is in the on-state, and the NMOS FINFET FN21 is in the off-state irrespective of the level (high or low) of the voltage input to the first gate terminals. That is, in the comparator using the inverter in which the switches are assigned as described above, the reset operation is performed when the clock signal CK is low, and the comparison operation is performed when the clock signal CK is high.

Next, setting of the threshold voltage Vt of a case where the NMOS FINFET FN21 is made to function as a reset switch, and the PMOS FINFET FP21 is made to function as an on/off switch will be described below. In order to assign the switch functions as described above, the threshold voltage Vt is set in such a manner that when the clock signal CK is high, the NMOS FINFET FN21 is in the on-state, and the PMOS FINFET FP21 is in the off-state irrespective of the level (high or low) of the voltage input to the first gate terminals. That is, in the comparator using the inverter in which the switches are assigned as described above, the reset operation is performed when the clock signal CK is high, and the comparison operation is performed when the clock signal CK is low.

An example of the comparator according to this embodiment will be described below with reference to FIG. 7.

Figure 7:
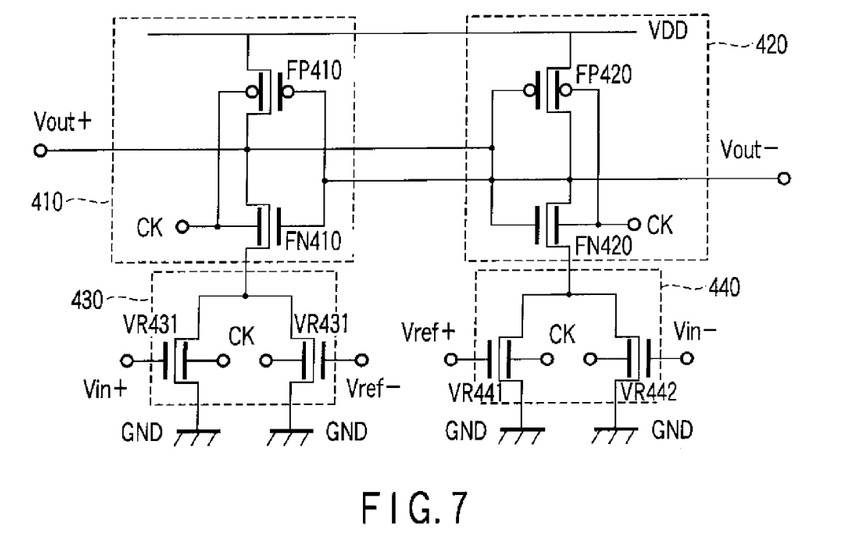
FIG. 7 is a circuit diagram showing an example of the comparator according to the second embodiment.

In a comparator shown in FIG. 7, the inverter shown in FIG. 6 is used as each of inverters 410 and 420, and the variable resistor shown in FIG. 3C is used as each of variable resistors 430 and 440. In the inverters 410 and 420, PMOS FINFETs FP410 and FP420 function as reset switches, and NMOS FINFETs FN410 and FN420 function as on/off switches.

The comparator shown in FIG. 7 repeats a reset operation and a comparison operation in accordance with the period of the clock signal CK. When a low clock signal CK is input, the reset switches in the inverters 410 and 420 are turned on, and the on/off switches are turned off. Accordingly, both output voltages Vout+ and Vout− of the inverters 410 and 420 are reset to the voltage of the power source VDD, and hence the comparator is not affected by the previous comparison result. During this period, a shoot-through current is suppressed because the NMOS FINFETs FN410 and FN420 are in the cutoff region. Further, the variable resistors 430 and 440 are also turned off simultaneously with the on/off switches, thereby restricting a leak current from the inverters 410 and 420.

When a high clock signal CK is subsequently input, the reset switches in the inverters 410 and 420 are turned off, and the on/off switches are turned on. Further, the variable resistors 430 and 440 are also turned on simultaneously with the on/off switches. Then, the output voltages Vout+ and Vout− that have been reset to the voltage of the power source VDD begin to fall. At this time, the variable resistors 430 and 440 differ from each other in the resistance value depending on the levels of the applied input voltage Vin and the reference voltage Vref, and hence the voltage falling rates of the output voltages Vout+ and Vout− differ from each other. Accordingly, the comparator is brought into the latch state where one of the output voltages Vout+ and Vout− is high, and the other is low. As described above, in the comparator shown in FIG. 7, the reset operation and the comparison operation are repeated according to the level of the clock signal CK.

As described above, in the comparator according to this embodiment, inverters constituted of NMOS FinFETs and PMOS FinFETs are used, and a clock signal is input to their second gate terminals, thereby making them function as reset switches and on/off switches. Therefore, according to the comparator associated with this embodiment, the transistor used for the reset switch in the inverter constituting the comparator according to the first embodiment described previously is made unnecessary, and the number of used transistors is reduced. Thus, it is possible to prevent the operation speed of the comparator from being lowered due to the parasitic capacity.

Third Embodiment

In a comparator according to a third embodiment of the present invention, an inverter shown in FIG. 8A, 8B, 8C, 8D or 8E is used. Inverters to be used in the comparator according to this embodiment will be described below with reference to FIGS. 8A, 8B, 8C, 8D, and 8E.

Figure 8A:
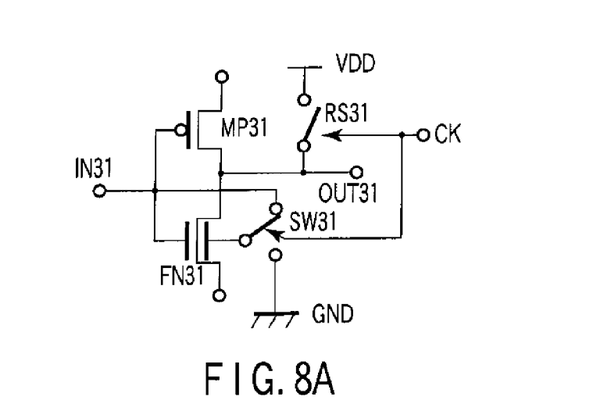
FIG. 8A is a circuit diagram showing an example of an inverter used for a comparator according to a third embodiment.

An inverter shown in FIG. 8A is the inverter shown in FIG. 2A described previously, in which the connection of the second gate terminal of the NMOS FINFET FN11 is changed; a signal input to an input terminal IN31 is inverted, and the inverted signal is output from an output terminal OUT31. A second gate terminal of an NMOS FINFET FN31 in the inverter shown in FIG. 8A is connected to one of an inverter input terminal IN31 and the ground power source GND through a clock-controlled switch SW31. This switch SW31 connects the second gate terminal to the ground power source GND when the clock signal CK is low, and connects the second gate terminal to the inverter input terminal IN31 when the clock signal CK is high.

Accordingly, in the inverter shown in FIG. 8A, when the clock signal CK is low, the reset switch RS31 is turned on, the inverter output is reset to the voltage of the power source VDD, and the NMOS FINFET FN31 is connected to the ground power source GND at the second gate terminal thereof through the switch SW31, whereby the NMOS FINFET FN31 is brought into the cutoff region, and the shoot-through current is suppressed. On the other hand, when the clock signal CK is high, the reset switch RS31 is turned off, the second gate terminal of the NMOS FINFET FN31 is connected to the inverter input terminal IN31, and a drain current flows. Therefore, according to the inverter shown in FIG. 8A, the current driving force twice as large as the inverter shown in FIG. 2A can be obtained.

Figure 8B:
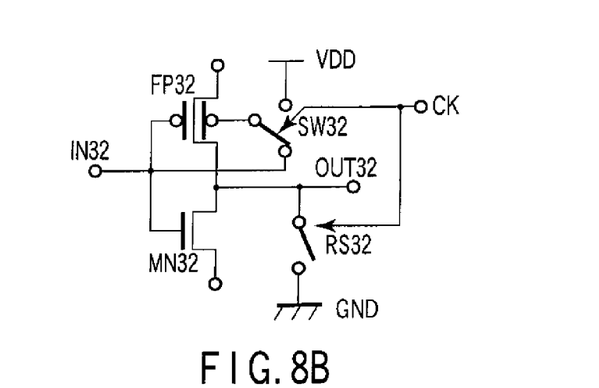
FIG. 8B is a circuit diagram showing an example of the inverter used for the comparator according to the third embodiment.

An inverter shown in FIG. 8B is the inverter shown in FIG. 2B described previously in which the connection of the second gate terminal of the PMOS FINFET FP11 is changed; a signal input to the input terminal IN32 is inverted, and the inverted signal is output from an output terminal OUT32. A second gate terminal of a PMOS FINFET FP32 in the inverter shown in FIG. 8B is connected to one of an inverter input terminal IN32 and the power source VDD through a clock-controlled switch SW32. This switch SW32 connects the second gate terminal to the power source VDD when the clock signal CK is high, and connects the second gate terminal to the inverter input terminal IN32 when the clock signal CK is low.

Accordingly, in the inverter shown in FIG. 8B, when the clock signal CK is high, the reset switch RS32 is turned on, the inverter output is reset to the voltage of the ground power source OND, and the PMOS FINFET FP32 is connected to the power source VDD at the second gate terminal thereof through the switch SW32, whereby the PMOS FINFET FP32 is brought into the cutoff region, and the shoot-through current is suppressed. On the other hand, when the clock signal CK is low, the reset switch RS32 is turned off, the second gate terminal of the PMOS FINFET FP32 is connected to the inverter input terminal IN32, and a drain current flows. Therefore, according to the inverter shown in FIG. 8B, the current driving force twice as large as the inverter shown in FIG. 2B can be obtained.

Figure 8C:
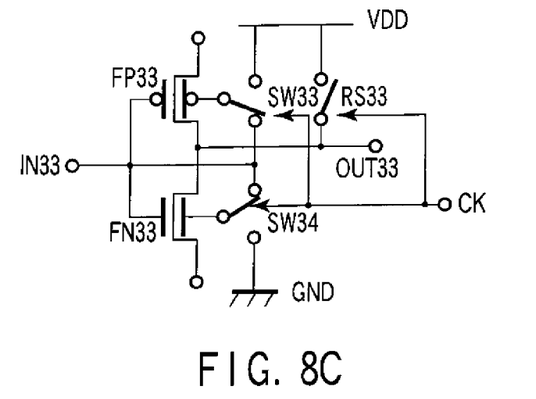
FIG. 8C is a circuit diagram showing an example of the inverter used for the comparator according to the third embodiment.

An inverter shown in FIG. 8C is the inverter shown in FIG. 2C described previously in which the connection of the second gate terminals of the NMOS FINFET FN12 and the PMOS FINFET FP12 is changed; a signal input to the input terminal IN33 is inverted, and the inverted signal is output from an output terminal OUT33. A second gate terminal of an NMOS FINFET FN33 in the inverter shown in FIG. SC is connected to one of an inverter input terminal IN33 and the ground power source GND through a clock-controlled switch SW34. This switch SW34 connects the second gate terminal to the ground power source GND when the clock signal CK is low, and connects the second gate terminal to the inverter input terminal IN33 when the clock signal CK is high. Further, a second gate terminal of the PMOS FINFET FP33 is connected to one of the inverter input terminal IN33 and the power source VDD through a clock-controlled switch SW33. This switch SW33 connects the second gate terminal to the power source VDD when the clock signal CK is high, and connects the second gate terminal to the inverter input terminal IN33 when the clock signal CK is low.

Accordingly, in the inverter shown in FIG. 8C, when the clock signal CK is low, the reset switch RS33 is turned on, the inverter output is reset to the voltage of the power source VDD, and the NMOS FINFET FN33 is connected to the ground power source GND at the second gate terminal thereof through the switch SW34, whereby the NMOS FINFET FN33 is brought into the cutoff region, and the shoot-through current is suppressed. Further, the PMOS FINFET FP33 is connected to the power source VDD at the second gate terminal thereof through the switch SW33. On the other hand, when the clock signal CK is high, the reset switch RS33 is turned off, the second gate terminal of the NMOS FINFET FN33 is connected to the inverter input terminal IN33, and a drain current flows. Further, the second gate terminal of the PMOS FINFET FP33 is also connected to the inverter input terminal IN33, and a drain current flows. Therefore, according to the inverter shown in FIG. 8C, the current driving force twice as large as the inverter shown in FIG. 2C can be obtained.

Figure 8D:
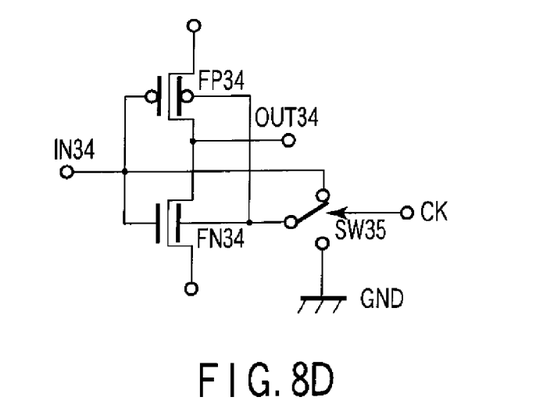
FIG. 8D is a circuit diagram showing an example of the inverter used for the comparator according to the third embodiment.
Figure 8E:
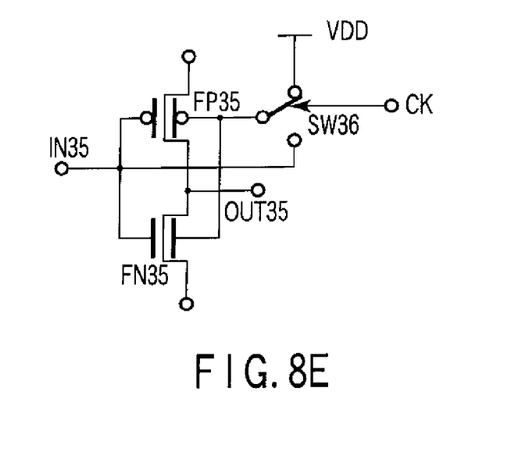
FIG. 8E is a circuit diagram showing an example of the inverter used for the comparator according to the third embodiment.

Each of inverters shown in FIGS. 8D and 8E is the inverter shown in FIG. 6 described previously in which the connection of the second gate terminals of the NMOS FINFET FN21 and the PMOS FINFET FP21 is changed. Second gate terminals of an NMOS FINFET FN34 and a PMOS FINFET FP34 in the inverter shown in FIG. 8D are connected to one of an inverter input terminal IN34 and the ground power source GND through a clock-controlled switch SW35. This switch SW35 connects the second gate terminals to the ground power source GND when the clock signal CK is low, and connects the second gate terminals to the inverter input terminal IN34 when the clock signal CK is high. The inverter shown in FIG. 8D inverts a signal input to the input terminal IN34, and outputs the inverted signal from an output terminal OUT34.

Accordingly, in the inverter shown in FIG. 8D, when the clock signal CK is low, the inverter output is reset to the voltage of the power source VDD by the PMOS FINFET FP34, and the NMOS FINFET FN34 is connected to the ground power source GND at the second gate terminal thereof through the switch SW35, whereby the NMOS FINFET FN34 is brought into the cutoff region, and the shoot-through current is suppressed. On the other hand, when the clock signal CK is high, the second gate terminals of the NMOS FINFET FN34 and the PMOS FINFET FP34 are connected to the inverter input terminal IN34, and a drain current flows.

Second gate terminals of an NMOS FINFET FN35 and a PMOS FINFET FP35 in the inverter shown in FIG. 8E are connected to one of an inverter input terminal IN35 and the power source VDD through a clock-controlled switch SW36. This switch SW36 connects the second gate terminals to the power source VDD when the clock signal CK is high, and connects the second gate terminals to the inverter input terminal IN35 when the clock signal CK is low. The inverter shown in FIG. 8E inverts a signal input to the input terminal IN35, and outputs the inverted signal from an output terminal OUT35.

Accordingly, in the inverter shown in FIG. 8E, when the clock signal CK is high, the inverter output is reset to the voltage of the ground power source GND by the NMOS FINFET FN35, and the PMOS FINFET FP35 is connected to the power source VDD at the second gate terminal thereof through the switch SW36, whereby the PMOS FINFET FP35 is brought into the cutoff region, and the shoot-through current is suppressed. On the other hand, when the clock signal CK is low, the second gate terminals of the NMOS FINFET FN35 and the PMOS FINFET FP35 are connected to the inverter input terminal IN35, and a drain current flows. Therefore, according to the inverters shown in FIGS. 8D and 8E, the current driving force twice as large as the inverter shown in FIG. 6 can be obtained.

An example of the comparator according to this embodiment will be described below with reference to FIG. 9.

Figure 9:
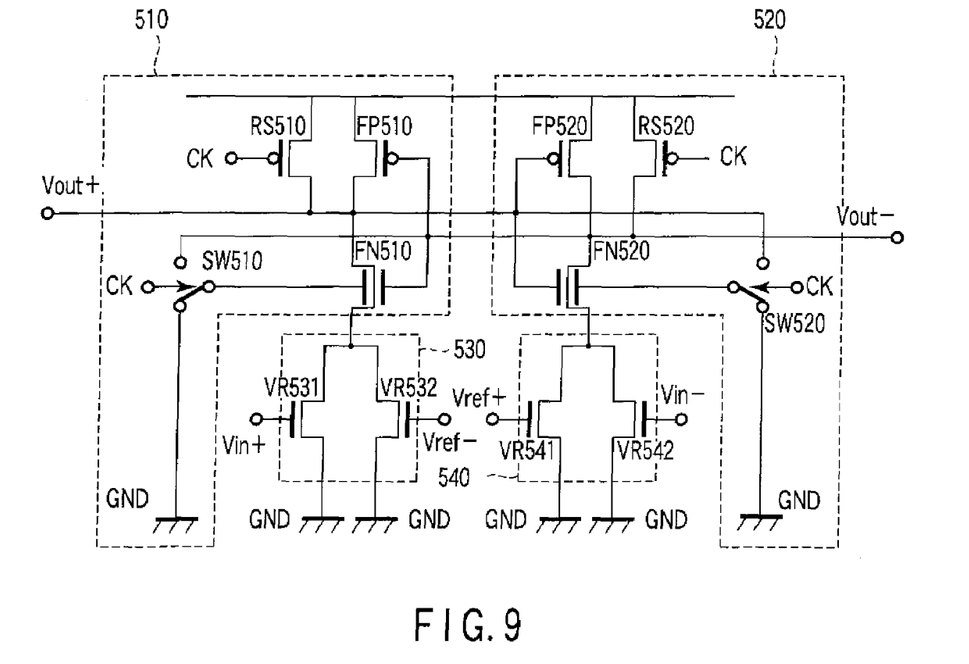
FIG. 9 is a circuit diagram showing an example of the comparator according to the third embodiment.

In a comparator shown in FIG. 9, the inverter shown in FIG. 8A is used as each of inverters 510 and 520, and the variable resistor shown in FIG. 3A is used as each of variable resistors 530 and 540. The comparator shown in FIG. 9 repeats a reset operation and a comparison operation in accordance with the period of the clock signal CK. When a low clock signal CK is input, reset switches RS510 and RS520 in the inverters 510 and 520 are turned on, and NMOS FINFETs FN510 and FN520 are connected to the ground power source GND at their second gate terminals, whereby the NMOS FINFETs FN510 and FN520 are brought into the cutoff region. Accordingly, both output voltages Vout+ and Vout− of the inverters 510 and 520 are reset to the voltage of the power source VDD, and hence the comparator is not affected by the previous comparison result. During this period, a shoot-through current is suppressed because the NMOS FINFETs FN510 and FN520 are in the cutoff region.

When a high clock signal CK is subsequently input, the reset switches RS510 and RS520 in the inverters 510 and 520 are turned off, and the NMOS FINFETs FN510 and FN520 are connected to the inverter input at their second gate terminals, whereby the NMOS FINFETs FN510 and FN520 operate as double gate transistors. Then, the output voltages Vout+ and Vout− that have been reset to the voltage of the power source VDD begin to fall. At this time, the variable resistors 530 and 540 differ from each other in the resistance value depending on the levels of the applied input voltage Vin and the reference voltage Vref, and hence the voltage falling rates of the output voltages Vout+ and Vout− differ from each other. Accordingly, the comparator is brought into the latch state where one of the output voltages Vout+ and Vout− is high, and the other is low. As described above, in the comparator shown in FIG. 9, the reset operation and the comparison operation are repeated according to the level of the clock signal CK.

As described above, in the comparator according to this embodiment, the second gate terminal of the FinFET constituting the inverter is connected to the first gate terminal, and the FinFET is operated as a double gate transistor. Therefore, according to the comparator associated with this embodiment, the current driving force twice as large as the first or second embodiment in which the second gate terminal of the FinFET is mainly used for the on/off control of the FinFET can be obtained.

Fourth Embodiment

An ADC according to a fourth embodiment of the present invention is constituted by using a plurality of comparators according to one of the first to third embodiments described previously. The ADC according to this embodiment is, for example, a pipeline ADC, in which a sample-and-hold (S/H) circuit 610, an error correcting block 620, and a plurality of cascade-connected conversion stages 600 are provided as shown in FIG. 10.

Figure 10:
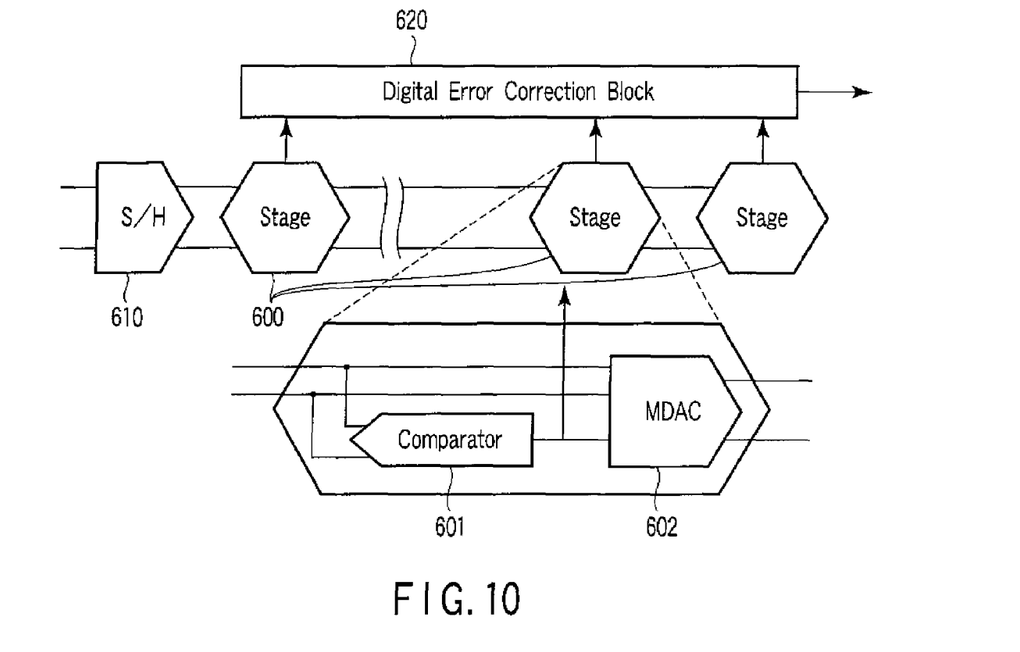
FIG. 10 is a block diagram showing an ADC according to a fourth embodiment.

In the ADC shown in FIG. 10, an analog input signal sampled and held by the S/H circuit 610 is input to the first stage of the plural conversion stages 600, digital signals output from the conversion stages 600 are subjected to error correction by the error correction block 620, and the error-corrected digital signals are combined with each other, thereby extracting a digital output signal.

Such a pipeline ADC are widely known, and in this embodiment, the comparator according to any one of the first to third embodiment is used in the conversion stage 600 as a comparator 601. Therefore, according to the ADC associated with this embodiment, a circuit for generating a plurality of different reference voltages is not required, further, the operation speed of the comparator is prevented from being lowered, and hence high-speed A/D conversion is enabled. Even in a configuration in which the A/D conversion speed has been limited by the operation speed of the comparator, a high-speed operation is enabled by the ADC according to this embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

As an example of the above, in each of the comparators described in the above embodiments, by reversing the polarities of the transistors, the same effect can be obtained. Further, although the variable resistor is constituted of a MOS transistor pair or a FinFET pair, these pairs may be constituted of one MOS transistor or one FinFET, and an input signal and a reference signal of a single phase may be received at the gate terminal.

What is claimed is:

1. A comparator comprising:
   first and second power source terminals;
   a first variable resistor which is connected to the first power source terminal at one end, and a resistance value of which changes according to voltages of a positive phase input signal and a negative phase reference signal;
   a second variable resistor which is connected to the first power source terminal at one end, and a resistance value of which changes according to voltages of a negative phase input signal and a positive phase reference signal;
   a first inverter which is inserted between the second power source terminal and other end of the first variable resistor, includes a first FinFET provided with a first gate terminal for receiving a positive phase output signal, and a second gate terminal for receiving a clock signal changing between a first level and a second level, inverts the positive phase output signal, and outputs a negative phase output signal;
   a second inverter which is inserted between the second power source terminal and other end of the second variable resistor, includes a second FinFET provided with a third gate terminal for receiving the negative phase output signal, a fourth gate terminal for receiving the clock signal, and the same polarity as the first FinFET, inverts the negative phase output signal, and outputs the positive phase output signal; and
   a first switch and a second switch which reset the output voltages of the first inverter and the second inverter to a voltage of the first or the second power source terminal when the clock signal is at the first level.

2. The comparator according to claim 1, wherein
   in the first FinFET and the second FinFET, threshold voltages by which the first FinFET and the second FinFET are brought into a cutoff region when the clock signal is at the first level are set.

3. The comparator according to claim 1, wherein
   the first variable resistor includes a first MOS transistor pair which are connected in parallel with each other, are controlled by the positive phase input signal and the negative phase reference signal, and operate in a linear region, and
   the second variable resistor includes a second MOS transistor pair which are connected in parallel with each other, are controlled by the negative phase input signal and the positive phase reference signal, and operate in a linear region.

4. The comparator according to claim 1, wherein
   the first variable resistor includes a first FinFET pair which are connected in parallel with each other, are controlled by the positive phase input signal and the clock signal that constitute a pair, and the negative phase reference signal and the clock signal that constitute a pair, are brought into a cutoff region when the clock signal is at the first level, and operate in a linear region when the clock signal is at the second level, and
   the second variable resistor includes a second FinFET pair which are connected in parallel with each other, are controlled by the negative phase input signal and the clock signal that constitute a pair, and the positive phase reference signal and the clock signal that constitute a pair, are brought into a cutoff region when the clock signal is at the first level, and operate in a linear region when the clock signal is at the second level.

5. An analog-to-digital converter including the plurality of comparators according to claim 1.

6. An analog-to-digital converter comprising:
a sample-and-hold circuit which samples and holds an analog input signal;
a plurality of conversion stages each of which includes the comparator according to claim 1, and which are cascade-connected on the output side of the sample-hold-circuit; and
a combine unit configured to combine the positive phase output signal and the negative phase output signal output from the comparator of each conversion stage with each other to form a digital output signal.

\* \* \* \* \*